United States Patent
Iguchi

(10) Patent No.: US 8,913,401 B2
(45) Date of Patent: Dec. 16, 2014

(54) MULTILAYER WIRING BOARD

(71) Applicant: Fuji Xerox Co., Ltd., Minato-ku, Tokyo (JP)

(72) Inventor: Daisuke Iguchi, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 41 days.

(21) Appl. No.: 13/922,349

(22) Filed: Jun. 20, 2013

(65) Prior Publication Data

US 2014/0133115 A1    May 15, 2014

(30) Foreign Application Priority Data

Nov. 14, 2012  (JP) ................................ 2012-250514
Nov. 22, 2012  (JP) ................................ 2012-256796

(51) Int. Cl.

| H05K 1/11 | (2006.01) |
|---|---|
| H05K 7/00 | (2006.01) |
| H05K 1/02 | (2006.01) |
| H05K 1/14 | (2006.01) |
| H05K 1/16 | (2006.01) |
| H05K 1/18 | (2006.01) |

(52) U.S. Cl.
CPC .............. *H05K 1/0243* (2013.01); *H05K 1/141* (2013.01); *H05K 1/162* (2013.01); *H05K 1/181* (2013.01); *H05K 2201/041* (2013.01); *H05K 2201/09309* (2013.01); *H05K 2201/09327* (2013.01)
USPC ........... 361/803; 361/760; 361/780; 361/794; 174/262

(58) Field of Classification Search
USPC ........... 174/260, 261; 361/760, 780, 803, 794
See application file for complete search history.

(56) References Cited

U.S. PATENT DOCUMENTS

| 6,521,843 | B1 | 2/2003 | Kohya | |
| 7,791,227 | B2 * | 9/2010 | Cases et al. ................... | 307/147 |
| 2002/0015293 | A1 * | 2/2002 | Akiba et al. .................. | 361/793 |
| 2002/0176236 | A1 * | 11/2002 | Iguchi et al. ................... | 361/753 |
| 2004/0118600 | A1 * | 6/2004 | Lee et al. ....................... | 174/260 |
| 2007/0097658 | A1 * | 5/2007 | Yang et al. .................... | 361/780 |
| 2007/0289771 | A1 * | 12/2007 | Osaka et al. .................. | 174/250 |
| 2011/0247869 | A1 | 10/2011 | Koyama | |

FOREIGN PATENT DOCUMENTS

| JP | 11-233951 A | 8/1999 |
| JP | 11-330703 A | 11/1999 |
| JP | 2010-199553 A | 9/2010 |

* cited by examiner

*Primary Examiner* — Hoa C Nguyen
(74) *Attorney, Agent, or Firm* — Sughrue Mion, PLLC

(57) ABSTRACT

A multilayer wiring board includes a signal electrode, a first power supply electrode, and a ground electrode, which are connected to a first element that outputs a signal, an electrode connected to a second element that receives the signal, a ground layer that serves as a return path for a return current of the signal, a first power supply layer that is disposed adjacent to the ground layer with a dielectric layer interposed therebetween and supplies electric power to the first element, and a second power supply layer that is provided independently of the first power supply layer and supplies electric power to the second element. The first power supply layer causes the return current to return to the first element through the first power supply electrode as a displacement current between the ground layer and the first power supply layer.

12 Claims, 12 Drawing Sheets

US 8,913,401 B2

MULTILAYER WIRING BOARD

CROSS-REFERENCE TO RELATED APPLICATIONS

This application is based on and claims priority under 35 USC 119 from Japanese Patent Application No. 2012-250514 filed Nov. 14, 2012, and Japanese Patent Application No. 2012-256796 filed Nov. 22, 2012.

BACKGROUND

Technical Field

The present invention relates to a multilayer wiring board.

SUMMARY

According to an aspect of the invention, there is provided a multilayer wiring board including a signal electrode, a first power supply electrode, and a ground electrode that are provided on a mounting surface and connected to a first element that outputs a signal; an electrode that is provided on the mounting surface and connected to a second element that receives the signal output from the first element through the signal electrode; a ground layer that is provided for both the first and second elements and serves as a return path for a return current of the signal received by the second element; a first power supply layer that is disposed adjacent to the ground layer with a dielectric layer interposed therebetween and supplies electric power to the first element through the first power supply electrode; and a second power supply layer that is provided independently of the first power supply layer and supplies electric power to the second element. The first power supply layer causes the return current that flows through the ground layer to return to the first element through the first power supply electrode as a displacement current between the ground layer and the first power supply layer.

BRIEF DESCRIPTION OF THE DRAWINGS

Exemplary embodiments of the present invention will be described in detail based on the following figures, wherein:

FIGS. 9A to 9C show the simulation results of current density in a multilayer wiring board, wherein FIG. 9A shows the case in which a multilayer wiring board of a second comparative example is used, FIG. 9B shows the case in which a multilayer wiring board of a third comparative example is used, and FIG. 9C shows the case in which the multilayer wiring board according to the third exemplary embodiment is used;

DETAILED DESCRIPTION

Figure 1:
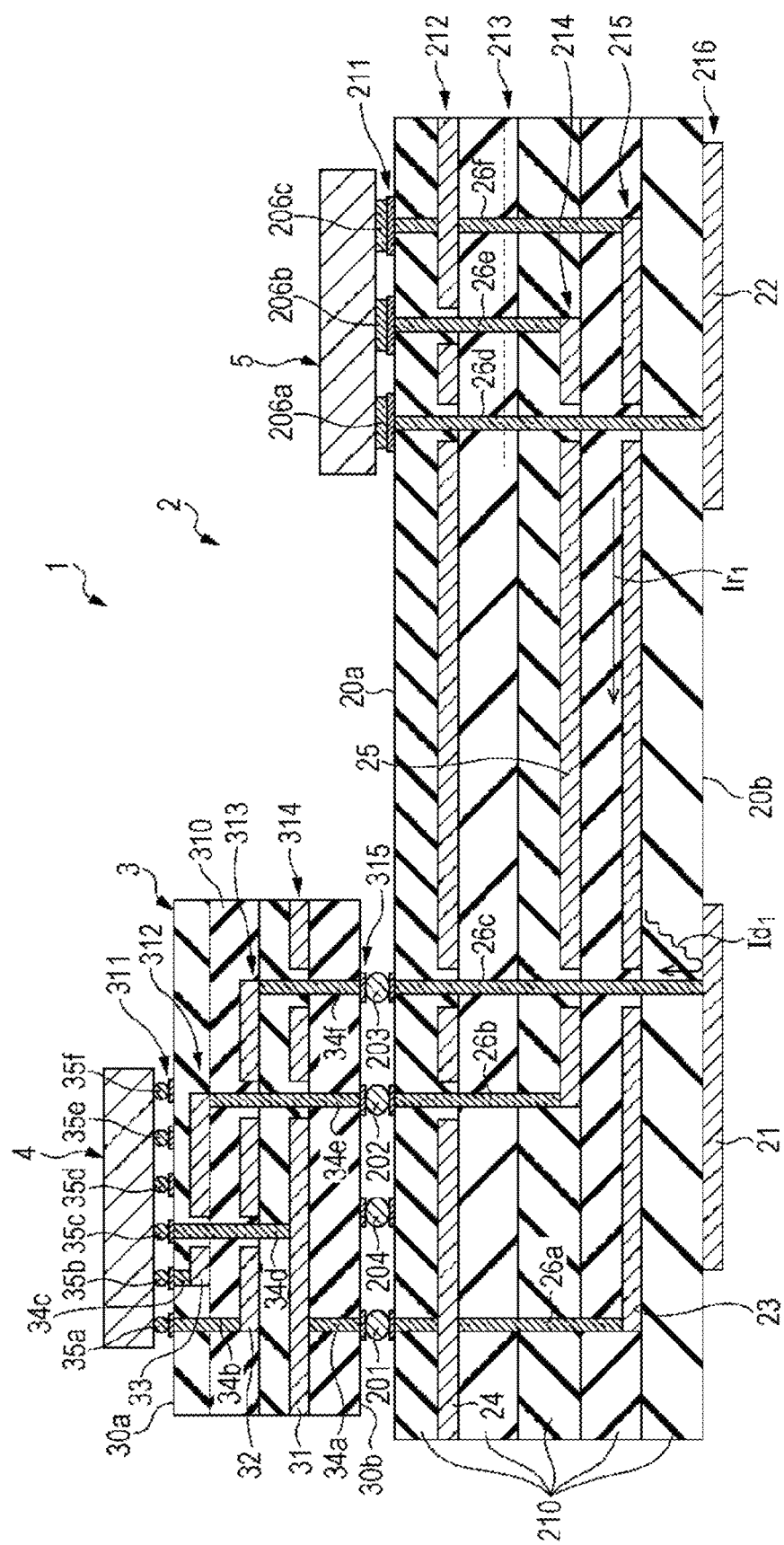
FIG. 1 is a sectional view of an example of a semiconductor device according to a first exemplary embodiment of the present invention.

Exemplary embodiments of the present invention will be described with reference to the drawings. In the drawings, components having substantially the same functions are denoted by the same reference numerals, and descriptions thereof are omitted to avoid redundancy.

First Exemplary Embodiment

Figure 2A:
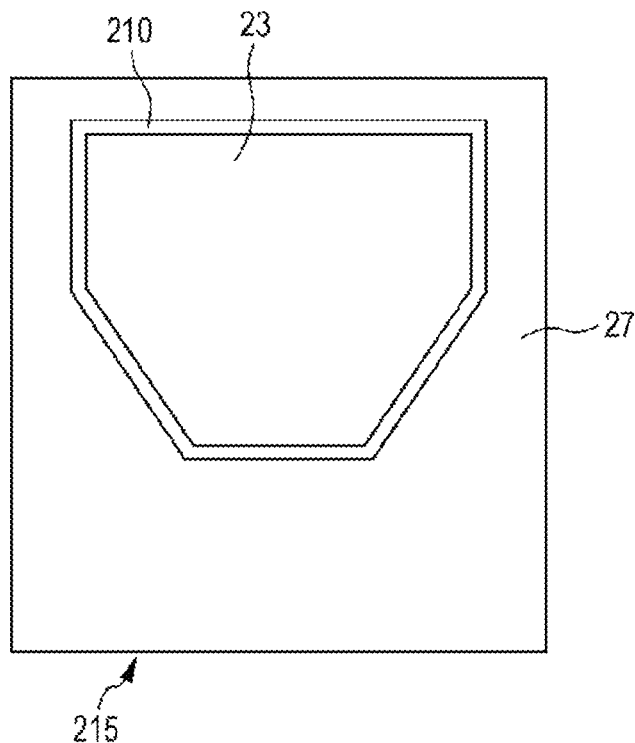
FIG. 2A is a plan view of an example of a fifth layer of a multilayer wiring board according to the first exemplary embodiment.
Figure 2B:
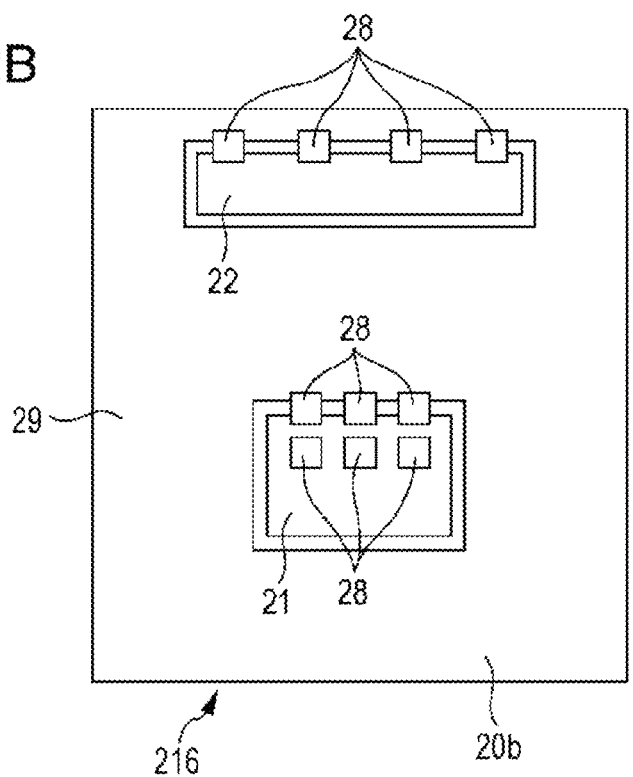
FIG. 2B is a plan view of an example of a sixth layer of the multilayer wiring board according to the first exemplary embodiment.

FIG. 1 is a sectional view illustrating an example the structure of a semiconductor device 1 according to a first exemplary embodiment of the present invention. FIG. 2A is a plan view of a fifth layer of a multilayer wiring board 2 illustrated in FIG. 1. FIG. 2B is a plan view of a sixth layer of the multilayer wiring board 2 illustrated in FIG. 1. FIGS. 2A and 2B illustrate a peripheral region that is not illustrated in FIG. 1.

The semiconductor device 1 includes a multilayer wiring board 2 having a mounting surface 20a; a mounting board 3 mounted on the mounting surface 20a; a first element 4, such as a processor, that is mounted on the mounting board 3 and outputs a signal through a signal electrode 202; and a second element 5, such as a memory, that is mounted on the multilayer wiring board 2 and receives the signal output from the first element 4.

Multilayer Wiring Board

The multilayer wiring board 2 includes a first ground layer 23 that serves as a return path for a return current $Ir_1$ of the signal received by the second element 5; a first power supply layer 21 that is formed on a back surface 20b of the multilayer wiring board 2 and supplies electric power of, for example, 1.5 V to the first element 4; a second power supply layer 22 that is formed on the back surface 20b of the multilayer wiring board 2 and supplies electric power of, for example, the same potential (1.5 V) as that of the electric power supplied to the first element 4; a signal wiring layer 25 that serves as a path for the signal output from the first element 4 to the second element 5; capacitors 28 (see FIG. 2B) that allows a low-frequency component of the return current $Ir_1$, which flows through the first ground layer 23, to pass therethrough to the first power supply layer 21; and a ground electrode 201, a first power supply electrode 203, and an electrode 204 arranged on the mounting surface 20a. The electrode 204 is connected to a signal wiring layer (not shown). The first ground layer 23 is an example of a ground layer.

The multilayer wiring board 2 includes first to sixth conductor layers 211 to 216 arranged in that order from the mounting surface 20a at the front side toward the back surface 20b, and dielectric layers 210 are disposed between the conductor layers 211 to 216.

The first conductor layer 211 is formed at the front side of the multilayer wiring board 2, and has the mounting surface 20a on which the mounting board 3 and the like are mounted. The second conductor layer 212 includes the second ground layer 24, which is formed over the entire area of the second dielectric layer 210. The third conductor layer 213 includes a signal wiring layer (not shown). The fourth conductor layer 214 includes the signal wiring layer 25. The fifth conductor layer 215 includes the first ground layer 23 and a base power supply layer 27 illustrated in FIG. 2A. The base power supply layer 27 supplies electric power of, for example, 3.3 V to the first element 4. The sixth conductor layer 216 is formed on the back surface 20b of the multilayer wiring board 2, and includes the first and second power supply layers 21 and 22 and a third ground layer 29 illustrated in FIG. 2B.

The first ground layer 23 is provided for both the first and second elements 4 and 5. The first ground layer 23 is connected to the first element 4 through a via 26a, the ground electrode 201, and the mounting board 3, and to the second element 5 through a via 26f and an electrode 206c.

As illustrated in FIG. 2A, the first ground layer 23 is included in the fifth conductor layer 215 of the multilayer wiring board 2. The first ground layer 23 is formed in an island shape so as to be independent of the base power supply layer 27 and surrounded by a dielectric layer 210.

The first power supply layer 21 is disposed adjacent to the first ground layer 23 with one of the dielectric layers 210 interposed therebetween. The first power supply layer 21 is connected to the first element 4 through a via 26c, the first power supply electrode 203, and the mounting board 3. The return current $Ir_1$ of the signal received by the second element 5, which flows through the first ground layer 23, returns to the first element 4 as a displacement current $Id_1$ from the first ground layer 23 to the first power supply layer 21.

As illustrated in FIG. 2B, the first power supply layer 21 is included in the sixth conductor layer 216, and is formed in an island shape so as to be independent of the third ground layer 29 and exposed at the back surface 20b.

The second power supply layer 22 is provided independently of the first power supply layer 21, and is connected to the second element 5 through a via 26d and an electrode 206a. As illustrated in FIG. 2B, the second power supply layer 22 is formed in an island shape so as to be independent of the third ground layer 29 and exposed at the back surface 20b.

The signal wiring layer 25 is disposed adjacent to the first ground layer 23 with one of the dielectric layers 210 interposed therebetween. The signal wiring layer 25 is connected to the first element 4 through a via 26b, the signal electrode 202, and the mounting board 3, and to the second element 5 through a via 26e and an electrode 206b.

As illustrated in FIG. 2B, each of the first and second power supply layers 21 and 22 is provided with plural capacitors 28. The capacitors 28 connect the first and second power supply layers 21 and 22 to the first and second ground layers 23 and 24, respectively.

The capacitors 28 allow a low-frequency component of the return current $Ir_1$ of the signal received by the second element 5 to pass therethrough from the first ground layer 23 to the first power supply layer 21, thereby forming a signal return path for the low-frequency component of the return current $Ir_1$ through the first power supply electrode 203.

The ground electrode 201 is disposed on the mounting surface 20a of the multilayer wiring board 2, and connects the first ground layer 23 to a ground layer 31 of the mounting board 3. The first power supply electrode 203 is disposed on the mounting surface 20a, and connects the first power supply layer 21 of the multilayer wiring board 2 to a power supply layer 32 of the mounting board 3.

The signal electrode 202 is disposed adjacent to the first power supply electrode 203 on the mounting surface 20a, and connects the signal wiring layer 25 to a signal wiring layer 33 of the mounting board 3.

Mounting Board

The mounting board 3 includes the ground layer 31 that provides a ground potential for the first element 4; the power supply layer 32 that supplies electric power to the first element 4; the signal wiring layer 33 to which the first element 4 outputs the signal; and electrodes 35a to 35f that connect the first element 4 to vias 34b, 34c, and 34d and the like.

The mounting board 3 includes first to fifth conductor layers 311 to 315 that are arranged in that order from a mounting surface 30a at the front side toward a bonding surface 30b at the back side, and dielectric layers 310 disposed between the first to fifth conductor layers 311 to 315. The mounting surface 30a, on which the first element 4 is mounted, is formed on the first conductor layer 311. The bonding surface 30b, to which the ground electrode 201, the signal electrode 202, the first power supply electrode 203, and the electrode 204 of the multilayer wiring board 2 are connected, is formed on the fifth conductor layer 315. The electrodes 35a to 35f are arranged on the mounting surface 30a.

The signal wiring layer 33 of the mounting board 3 is included in the second conductor layer 312. The signal wiring layer 33 is connected to the first element 4 through the via 34c, and to the signal wiring layer 25 through a via 34e and the signal electrode 202. The via 34c, the signal wiring layer 33 of the mounting board 3, the via 34e, the signal electrode 202, the via 26b, the signal wiring layer 25 of the multilayer wiring board 2, the via 26e, and the electrode 206b are examples of elements that form a signal output path.

The power supply layer 32 is disposed adjacent to each of the ground layer 31 and the signal wiring layer 33 with one of the dielectric layers 310 interposed therebetween, and is included in the third conductor layer 313. The power supply layer 32 is connected to the first element 4 through the via 34b, and to the first power supply layer 21 through the via 34f and the first power supply electrode 203. The via 34b, the power supply layer 32 of the mounting board 3, the via 34f, the first power supply electrode 203, the via 26c, and the first power supply layer 21 of the multilayer wiring board 2 are examples of elements that form a power supply path.

The ground layer 31 is disposed adjacent to the power supply layer 32 with one of the dielectric layers 310 interposed therebetween, and is included in the fourth conductor layer 314. The ground layer 31 is connected to the first element 4 through the via 34d, and to the first and second ground layers 23 and 24 through the via 34a and the ground electrode 201.

Since the signal electrode 202 and the first power supply electrode 203 are disposed adjacent to each other, when the signal output from the first element 4 is transmitted through the signal electrode 202, capacitive coupling occurs between the path for outputting the signal to the second element 5 through the signal wiring layer 33 of the mounting board 3 and the path for supplying electric power to the first element 4 through the power supply layer 32 of the mounting board 3.

Operation of First Exemplary Embodiment

An example of an operation according to the first exemplary embodiment will now be described. First, flow of the signal output from the first element 4 and the return current $Ir_1$ will be described.

The first element 4 outputs a signal of, for example, 3.5 GHz at a maximum to the second element 5 through the signal electrode 202 and the signal wiring layer 25.

Next, the second element 5 processes the signal input from the first element 4, and outputs the return current $Ir_1$ of the input signal to the first ground layer 23.

The return current $Ir_1$ that has been output to the first ground layer 23 flows into the first power supply layer 21 as the displacement current $Id_1$. The displacement current $Id_1$ that has flowed into the first power supply layer 21 returns to the first element 4 through the first power supply electrode 203.

The low-frequency component of the return current $Ir_1$ that has been output to the first ground layer 23 passes through the capacitors 28 from the first ground layer 23 to the first power supply layer 21, and returns to the first element 4 through the first power supply layer 21 and the first power supply electrode 203.

The low-frequency component of the return current $Ir_1$ does not easily flow into the first power supply layer 21 from the first ground layer 23 as the displacement current $Id_1$ owing to the capacitance of the dielectric layers 210, and therefore passes through the capacitors 28 from the first ground layer 23 to the first power supply layer 21. A high-frequency component of the return current $Ir_1$ is not allowed to pass through the capacitors 28 owing to the inductance of the capacitors 28, and flows into the first power supply layer 21 as the displacement current $Id_1$.

Current Density Simulation

The current density of the signal output from the first element 4 and the return current will be compared with that in a first comparative example.

Figure 3A:
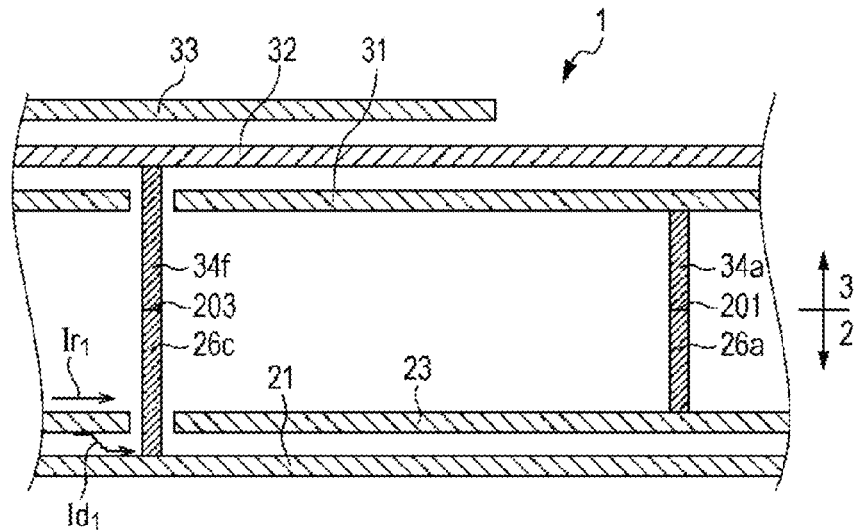
FIG. 3A is a schematic diagram illustrating an example of a semiconductor device according to the first exemplary embodiment.
Figure 3B:
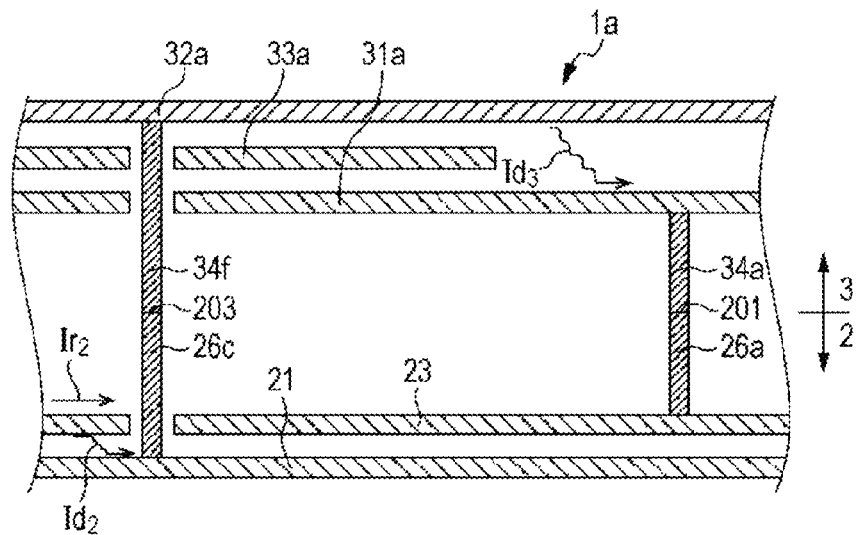
FIG. 3B is a schematic diagram illustrating a semiconductor device for simulation that corresponds to the first exemplary embodiment.
Figure 3C:
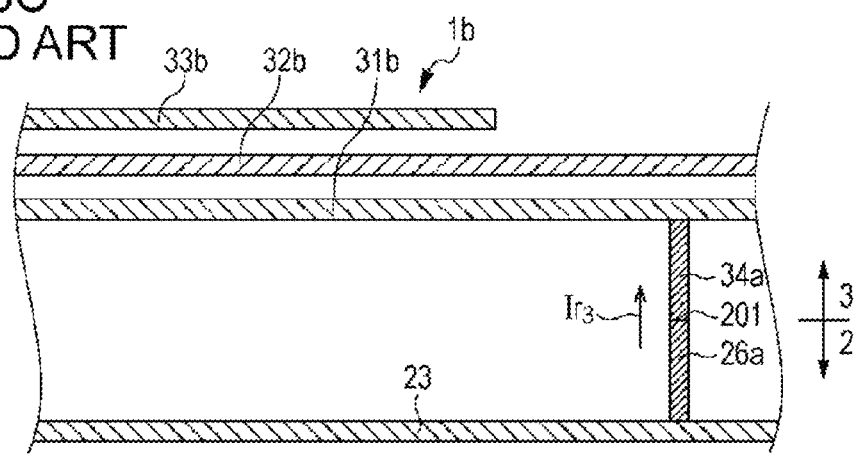
FIG. 3C is a schematic diagram illustrating a semiconductor device according to a first comparative example.

FIG. 3A is a schematic diagram illustrating an example of a semiconductor device according to the first exemplary embodiment. FIG. 3B is a schematic diagram illustrating a semiconductor device for simulation that corresponds to the first exemplary embodiment. FIG. 3C is a schematic diagram illustrating a semiconductor device according to the first comparative example.

FIG. 3B shows a semiconductor device 1a in which a power supply layer 32a of a mounting board 3 is connected to a first power supply layer 21 of a multilayer wiring board 2, a ground layer 31a is connected to a first ground layer 23 of the multilayer wiring board 2, and a signal wiring layer 33a is disposed between the power supply layer 32a and the ground layer 31a.

FIG. 3C shows a semiconductor device 1b in which no first power supply layer 21 is provided, a ground layer 31b of a mounting board 3 is connected to a first ground layer 23, and a signal wiring layer 33b is disposed adjacent to a power supply layer 32b at the front side of the mounting board 3.

Figure 4A:
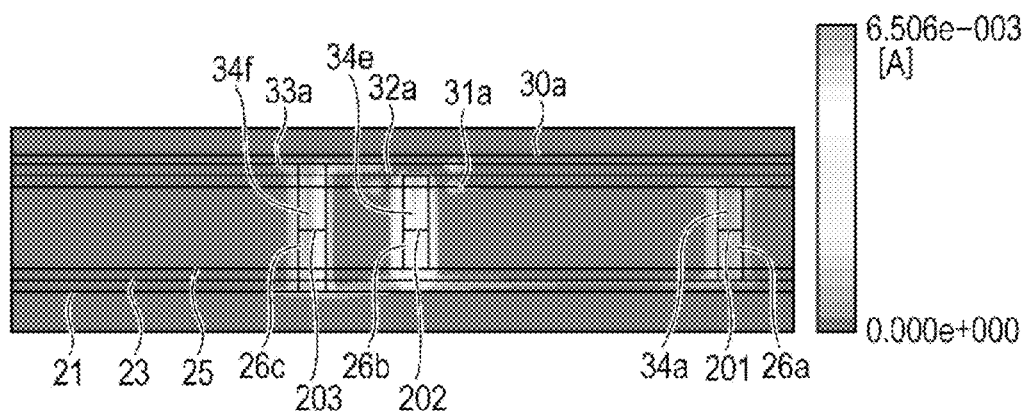
FIG. 4A shows the simulation result of the current density in the semiconductor device for simulation illustrated in FIG. 3B.
Figure 4B:
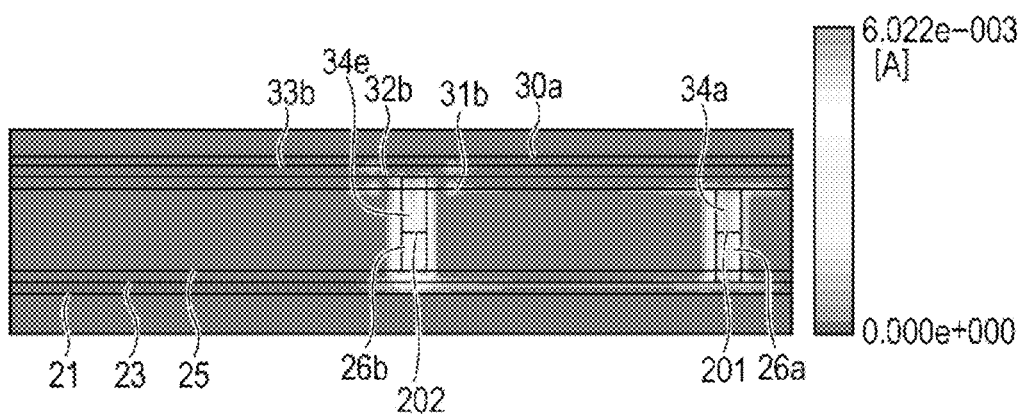
FIG. 4B shows the simulation result of the current density in the semiconductor device of the first comparative example.

FIG. 4A shows the simulation result of the current density in the semiconductor device for simulation illustrated in FIG. 3B. FIG. 4B shows the simulation result of the current density in the semiconductor device of the first comparative example.

The simulation result shown in FIG. 4A is the result of calculation performed by using a model of the semiconductor device 1a illustrated in FIG. 3B to obtain the current density of the signal output from the first element 4 and a return current $Ir_2$.

The simulation result shown in FIG. 4B is the result of calculation performed by using a model of the semiconductor device illustrated in FIG. 3C to obtain the current density of the signal output from the first element 4 and a return current $Ir_3$.

The simulation result of FIG. 4A shows that a path that passes through the first power supply electrode 203, which is closer to the signal electrode 202 than the vias 26a and 34a and the ground electrode 201, serves as a return path for the return current $Ir_2$ of the signal output from the first element 4.

The simulation result of FIG. 4B shows that the return current $Ir_3$ of the signal output from the first element 4 to the second element 5 flows through the ground electrode 201. It is clear from this simulation result that the ground electrode 201 serves as a return path for the return current $Ir_3$ in the multilayer wiring board 2 of the semiconductor device 1b illustrated in FIG. 3C.

In addition, the simulation results of FIGS. 4A and 4B show that, when the first power supply layer 21 is provided in the multilayer wiring board 2 and connected to the power supply layer 32 of the mounting board 3, the return current $Ir_2$ flows from the first ground layer 23 to the first power supply layer 21 as a displacement current $Id_2$. Furthermore, it is clear from FIGS. 4A and 4B that the current density of the return current $Ir_2$ that flows through the first power supply electrode 203 is high, and the path that passes through the vias 26c and 34f and the first power supply electrode 203 has an impedance lower than that of the path that passes through the vias 26a and 34a and the ground electrode 201.

The semiconductor device 1a illustrated in FIG. 3B used in the simulation of FIG. 4A differs from the semiconductor device 1 in that the signal wiring layer 33a of the mounting board 3 is disposed between the ground layer 31a and the power supply layer 32a. In the mounting board 3 of the semiconductor device 1a, the signal wiring layer 33a is disposed adjacent to both the ground layer 31a and the power supply layer 32a with a dielectric layer 310 interposed between the signal wiring layer 33a and the ground layer 31a and between the signal wiring layer 33a and the power supply layer 32a. Therefore, capacitive coupling occurs between the signal wiring layer 33a and the ground layer 31a and between the signal wiring layer 33a and the ground layer 31a. As a result, a part of the return current $Ir_2$ returns to the first element 4 through the ground electrode 201.

In contrast, in the semiconductor device 1, as illustrated in FIGS. 1 and 3A, the signal wiring layer 33 of the mounting board 3 is disposed adjacent to the power supply layer 32, but is not adjacent to the ground layer 31. Therefore, capacitive coupling occurs between the signal wiring layer 33 and the power supply layer 32 of the mounting board 3.

Accordingly, as compared with the simulation result shown in FIG. 4A, the current density of the return current $Ir_1$ in the multilayer wiring board 2 is expected to be higher in the first power supply electrode 203, which is closer to the signal electrode 202 than the ground electrode 201, and lower in the ground electrode 201.

In short, even when the power supply layer 32 of the mounting board 3 is adjacent to the signal wiring layer 33, the impedance of the return path for the return current $Ir_1$ may be reduced by arranging the first power supply layer 21 adjacent to the first ground layer 23 and locating the first power supply electrode 203 closer to the signal electrode 202 than the ground electrode 201.

In addition, since the return current $Ir_1$ flows through a path having a low impedance, dissipation of the return current $Ir_1$ into the first to third ground layers 23, 24, and 29 may be suppressed and the radiation noise may be reduced.

Simulation of Signal Attenuation

Attenuation of the signal output from the first element 4 to the second element 5 according to the present exemplary embodiment will be compared with that in the first comparative example.

Figure 5:
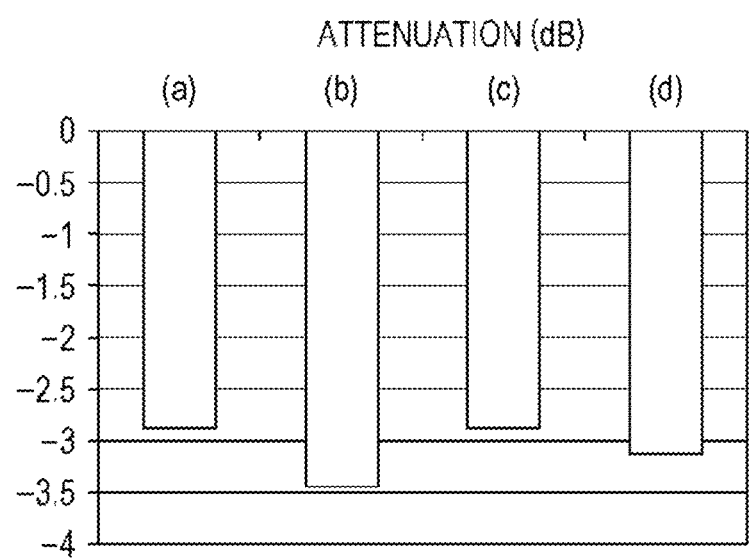
FIG. 5 shows simulation results of signal attenuation, wherein (a) and (b) show the cases in which a power supply layer of a mounting board serves as a signal return path and (c) and (d) show the cases in which a ground layer of the mounting board serves as the signal return path.

FIG. 5 shows examples of simulation results of signal attenuation, wherein (a) and (b) show the cases in which the power supply layer of the mounting board serves as a signal return path and (c) and (d) show the cases in which the ground layer of the mounting board serves as the signal return path.

In FIG. 5, (a) and (c) show the simulation results of signal attenuation performed by using the model of the semiconductor device 1a illustrated in FIG. 3B, and (b) and (d) show the simulation results of signal attenuation performed by using the model of the semiconductor device of the first comparative example illustrated in FIG. 3C.

In the simulation result of (a) in FIG. 5, the attenuation of the signal that uses the power supply layer 32 of the mounting board 3 as the return path is reduced by about 0.6 dB compared to that in the simulation result of (b) in FIG. 5. This is because the return current $Ir_2$ flows from the first ground layer 23 to the first power supply layer 21 as the displacement current $Id_2$, and the impedance of the signal return path is reduced accordingly.

In the simulation result of (c) in FIG. 5, the attenuation of the signal that uses the ground layer 31a of the mounting board 3 as the return path is reduced by about 0.3 dB compared to that in the simulation result of (d) in FIG. 5. This is probably because a part of the return current $Ir_2$ that flows through the first ground layer 23 flows into the first power supply layer 21 as the displacement current $Id_2$, and then returns to the ground layer 31 from the power supply layer 32 as a displacement current $Id_3$ in the mounting board 3.

In the semiconductor device 1 illustrated in FIG. 3A, as described above, the signal wiring layer 33 of the mounting board 3 is disposed adjacent to the power supply layer 32, but is not adjacent to the ground layer 31. Therefore, capacitive coupling occurs between the signal wiring layer 33 and the power supply layer 32, and most of the return current $Ir_1$ flows through the path having a low impedance. As a result, it is expected that the signal attenuation may be further reduced compared to that in the simulation result of (a) in FIG. 5.

Thus, in the multilayer wiring board 2 according to the present exemplary embodiment, the first power supply layer 21 is provided, and the return current $Ir_1$ is caused to return from the first ground layer 23 to the first element 4 through the first power supply layer 21 as the displacement current $Id_1$. Accordingly, the signal attenuation is reduced compared to that in the multilayer wiring board 2 of the first comparative example illustrated in FIG. 3C.

Advantages of First Exemplary Embodiment (a) Since the second power supply layer 22 is provided independently of the first power supply layer 21, the operation of the first element 4 may be stopped while the electric power is continuously supplied to the second element 5.

(b) Since the first power supply layer 21 is disposed adjacent to the first ground layer 23 with one of the dielectric layers 210 interposed therebetween, the attenuation of the signal output from the first element 4 may be reduced.

(c) Since the signal electrode 202 is disposed adjacent to the first power supply electrode 203, the impedance of the return path for the return current $Ir_1$ may be reduced, as is clear from the simulation result shown in FIGS. 4A and 4B.

(d) Since the capacitors 28 are provided, the path including the capacitors 28 function as a path for the low-frequency component of the return current $Ir_1$.

Second Exemplary Embodiment

Figure 6:
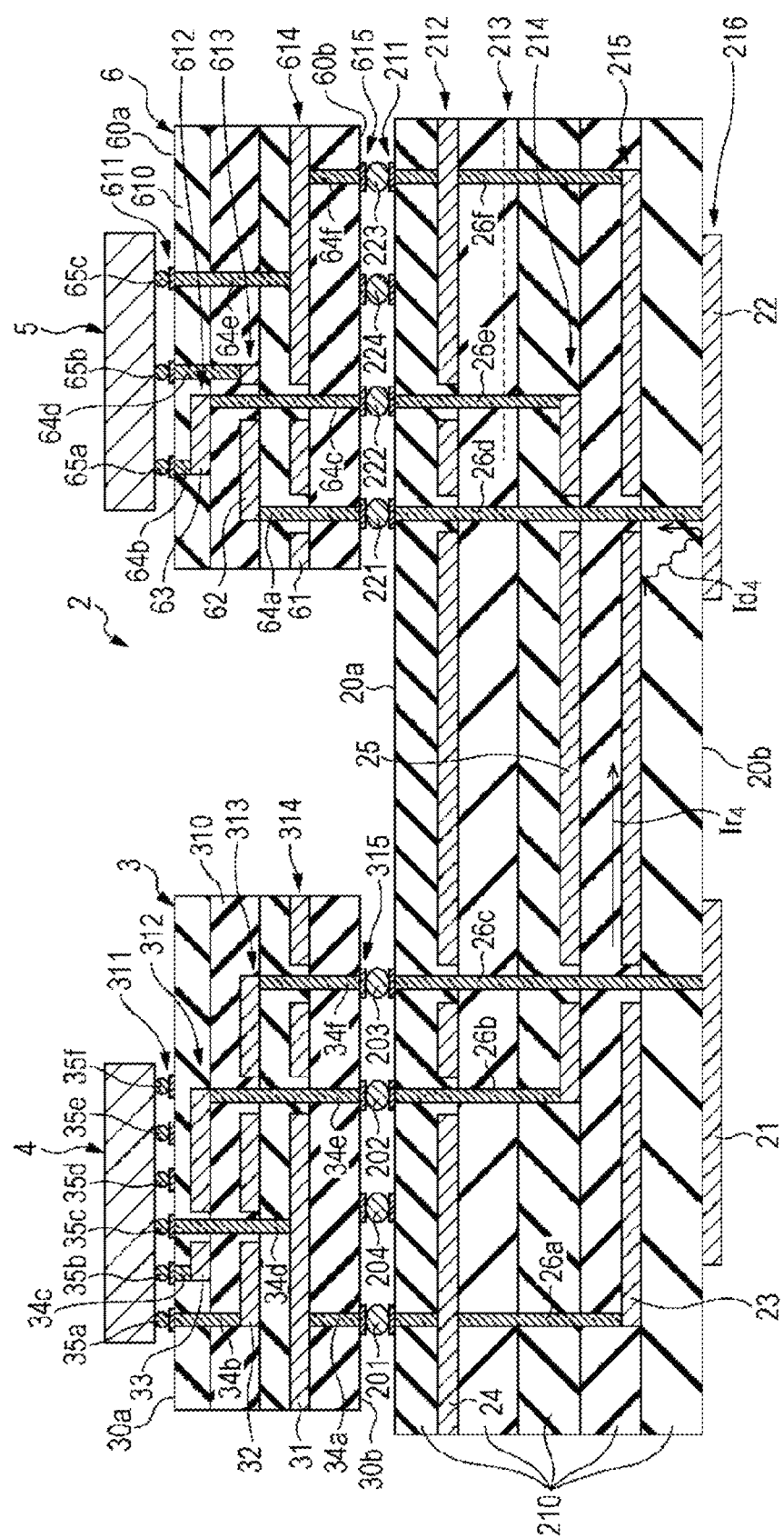
FIG. 6 is a sectional view of an example of a semiconductor device according to a second exemplary embodiment of the present invention.

FIG. 6 is a sectional view illustrating an example of the structure of a semiconductor device 1A according to a second exemplary embodiment of the present invention.

In the first exemplary embodiment, the semiconductor device 1 includes the multilayer wiring board 2, the first element 4 that outputs a signal to the second element 5, the mounting board 3 on which the first element 4 is mounted, and the second element 5 that receives the signal output from the first element 4. In the semiconductor device 1A according to the present exemplary embodiment, a first element 4 and a second element 5 communicate with each other. The second element 5 is mounted on a mounting board 6 provided on the multilayer wiring board 2. A second power supply electrode 221, a signal electrode 222, a ground electrode 223, and an electrode 224 are provided on a mounting surface 20a of the multilayer wiring board 2. Other structures are similar to those in the first exemplary embodiment. Differences from the first exemplary embodiment will be mainly described.

A second power supply layer 22 of the multilayer wiring board 2 according to the present exemplary embodiment causes a return current of the signal received by the first element 4, which flows through a first ground layer 23, to return to the second element 5 as a displacement current $Id_4$ between the first ground layer 23 and the second power supply layer 22.

The second power supply electrode 221 of the multilayer wiring board 2 is disposed on the mounting surface 20a of the multilayer wiring board 2, and connects an power supply layer 62 of the mounting board 6 to the second power supply layer 22 through a via 26d. The signal electrode 222 is disposed adjacent to the second power supply electrode 221 on the mounting surface 20a, and connects a signal wiring layer 63 of the mounting board 6 to a signal wiring layer 25 through a via 26e.

The ground electrode 223 is disposed on the mounting surface 20a of the multilayer wiring board 2, and connects a ground layer 61 of the mounting board 6 to the first ground layer 23 through a via 26f. The electrode 224 connects the mounting board 6 to a signal wire (not shown).

The mounting board 6 includes the ground layer 61 that provides a ground potential to the second element 5; the power supply layer 62 that supplies electric power to the second element 5; and the signal wiring layer 63 to which the second element 5 outputs the signal.

The mounting board 6 includes first to fifth conductor layers 611 to 615 and dielectric layers 610 disposed between the first to fifth conductor layers 611 to 615. The first conductor layer 611 has a mounting surface 60a, on which the second element 5 is mounted, at the front side thereof. The fifth conductor layer 615 has a bonding surface 60b, which is connected to the second power supply electrode 221, the signal electrode 222, the ground electrode 223, and the electrode 224 of the multilayer wiring board 2.

The signal wiring layer 63 of the mounting board 6 is included in the second conductor layer 612. The signal wiring layer 63 is connected to the second element 5 through a via 64b and an electrode 65a, and to the signal wiring layer 25 through a via 64c and the signal electrode 222.

The power supply layer 62 is disposed adjacent to each of the ground layer 61 and the signal wiring layer 63 with one of the dielectric layers 610 interposed therebetween, and is included in the third conductor layer 613. The power supply layer 62 is connected to the second element 5 through a via 64d and an electrode 65b, and to the second power supply layer 22 through a via 64a and the power supply electrode 221.

The ground layer 61 is disposed adjacent to the power supply layer 62 with one of the dielectric layers 610 interposed therebetween, and is included in the fourth conductor layer 614. The ground layer 61 is connected to the second element 5 through a via 64e and an electrode 65c, and to the first and second ground layers 23 and 24 through a via 64f and the ground electrode 223.

Operation of Second Exemplary Embodiment

An example of an operation according to the second exemplary embodiment will now be described.

The second element 5 outputs a signal to the first element 4 through the signal electrode 222 and the signal wiring layer 25.

Next, the first element 4 processes the signal input from the second element 5, and outputs the return current $Ir_4$ of the input signal to the first ground layer 23.

The return current $Ir_4$ that has been output to the first ground layer 23 flows into the second power supply layer 22 as the displacement current $Id_4$. The displacement current $Id_4$ that has flowed into the second power supply layer 22 returns to the second element 5 through the second power supply electrode 221.

Advantages of Second Exemplary Embodiment

Since the return current of the signal received by the second element 5 flows into the second power supply layer 22, which is adjacent to the first ground layer 23, as the displacement current $Id_4$, attenuation of the signal output from the second element 5 is reduced.

Third Exemplary Embodiment

Figure 7:
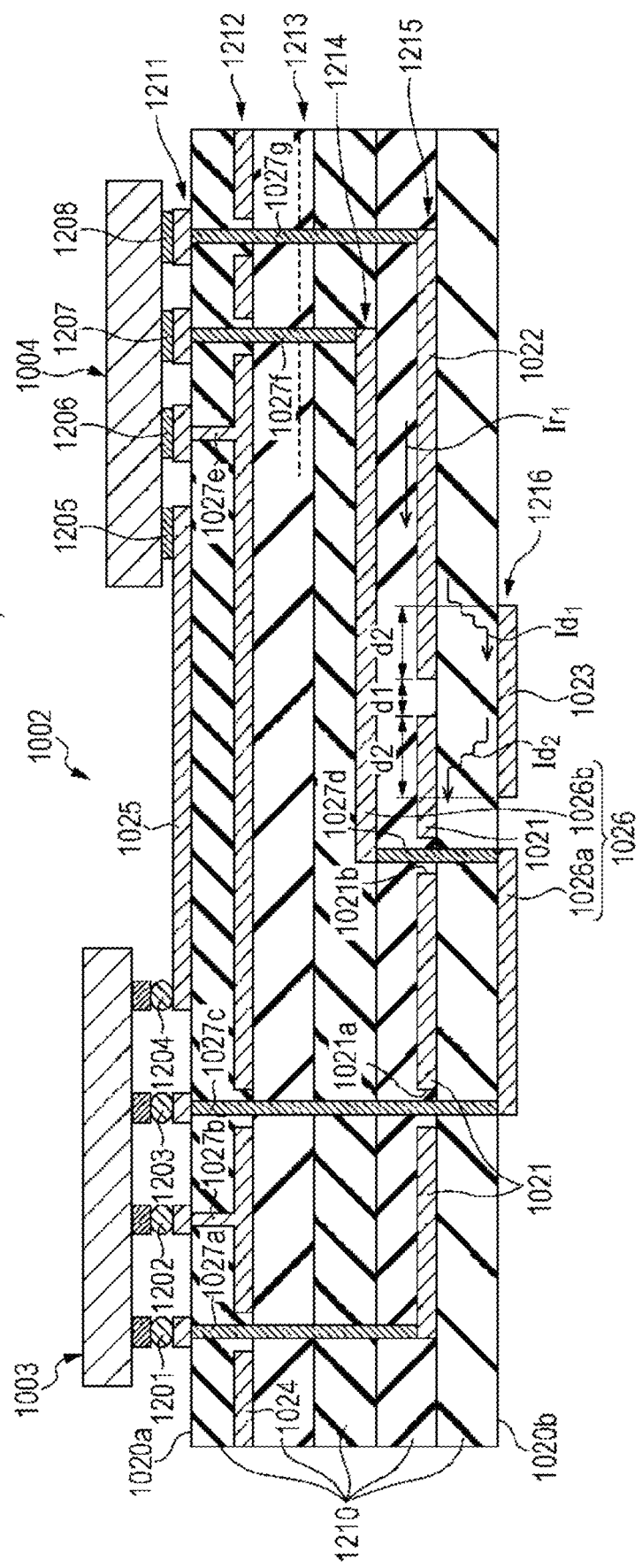
FIG. 7 is a sectional view of an example of a semiconductor device according to a third exemplary embodiment of the present invention.
Figure 8:
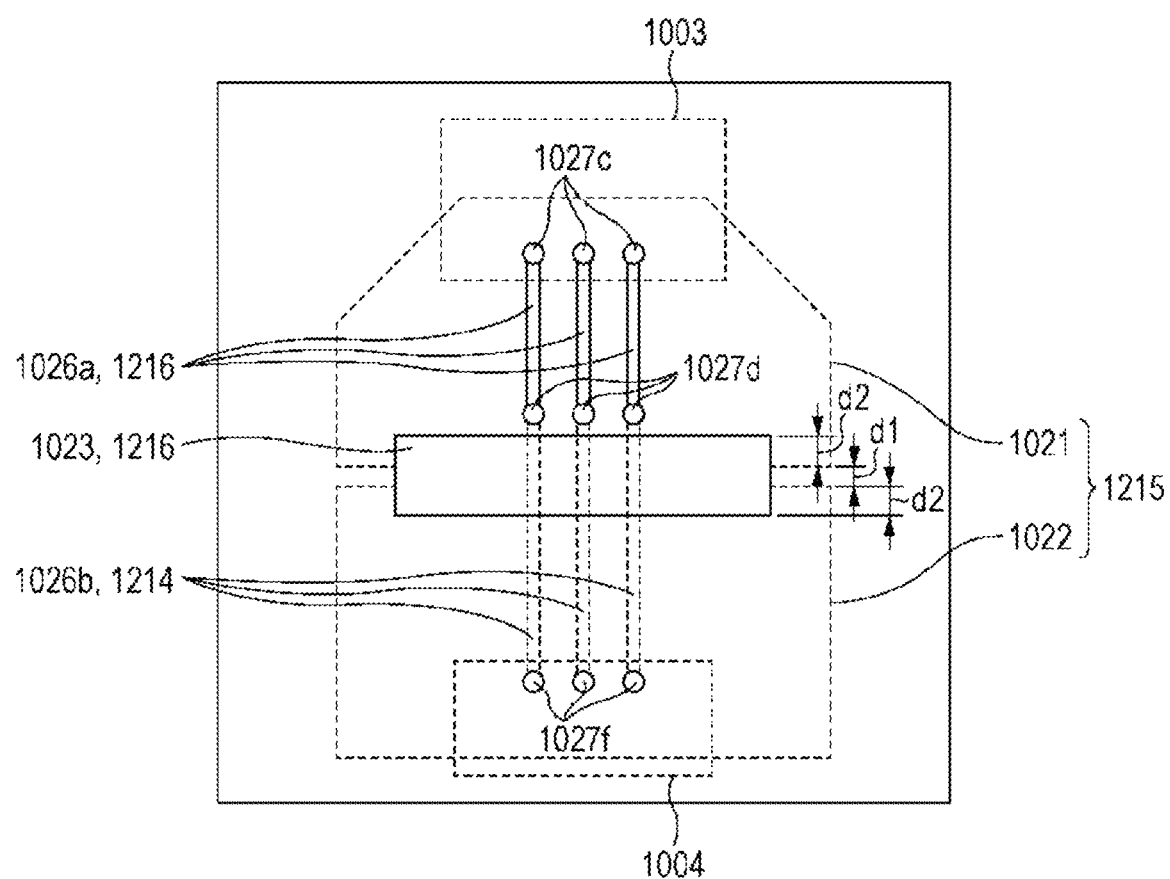
FIG. 8 is a schematic plan view of an example of a fifth layer of a multilayer wiring board according to the third exemplary embodiment.

FIG. 7 is a sectional view illustrating an example of the structure of a semiconductor device 1001 according to a third exemplary embodiment of the present invention. FIG. 8 is a plan view of a multilayer wiring board 1002 illustrated in FIG. 7.

The semiconductor device 1001 includes a multilayer wiring board 1002 having a mounting surface 1020a; a first element 1003, such as a processor, that is mounted on the mounting surface 1020a and outputs a signal; and a second element 1004, such as a memory, that is mounted on the multilayer wiring board 1002 and receives the signal output from the first element 1003.

Multilayer Wiring Board

The multilayer wiring board 1002 includes a first power supply layer 1021, a second power supply layer 1022, first and second signal wiring layers 1025 and 1026, an auxiliary layer 1023, a ground layer 1024, electrodes 1201 to 1204, and electrodes 1205 to 1208. The first power supply layer 1021 supplies electric power of, for example, 1.5 V to the first element 1003. The second power supply layer 1022 is electrically insulated from the first power supply layer 1021. The second power supply layer 1022 supplies electric power of, for example, the same potential (1.5 V) as that of the electric power supplied to the first element 1003 to the second element 1004, and serves as a return path for a return current $Ir_1$ of the signal output from the first element 1003. The first and second signal wiring layers 1025 and 1026 serve as paths of the signal output from the first element 1003 to the second element 1004. The auxiliary layer 1023 is disposed so as to partially overlap the first and second power supply layers 1021 and 1022 with a dielectric layer 1210 interposed therebetween, and causes the return current $Ir_1$ output from the first element 1003 to flow into the first power supply layer 1021 as a displacement current $Id_2$. The ground layer 1024 is provided for both the first and second elements 1003 and 1004. The electrodes 1201 to 1204 are arranged on the mounting surface 1020a, and connect the multilayer wiring board 1002 to the first element 1003. The electrodes 1205 to 1208 are arranged on the mounting surface 1020a, and connect the multilayer wiring board 1002 to the second element 1004.

The multilayer wiring board 1002 includes first to sixth conductor layers 1211 to 1216 arranged in that order from the mounting surface 1020a at the front side toward a back surface 1020b, and dielectric layers 1210 are disposed between the conductor layers 1211 to 1216.

The first conductor layer 1211 is formed on the front surface of the multilayer wiring board 1002, and includes the mounting surface 1020a, on which the first and second elements 1003 and 1004 are mounted, and the first signal wiring layer 1025. The second conductor layer 212 includes the ground layer 1024, which is formed over the entire area of the second dielectric layer 1210. The third conductor layer 1213 includes a signal wiring layer (not shown). The fourth conductor layer 1214 includes a wiring layer 1026b, which is a part of the second signal wiring layer 1026. The fifth conductor layer 1215 includes the first and second power supply layers 1021 and 1022. The sixth conductor layer 1216 is formed on the back surface 1020b of the multilayer wiring board 1002, and includes a wiring layer 1026a, which is a part of the second signal wiring layer 1026, and the auxiliary layer 1023.

The first power supply layer 1021 is connected to the first element 1003 through a via 1027a and the electrode 1201, and causes a displacement current $Id_2$, which flows into the first power supply layer 1021 from the auxiliary layer 1023, to return to the first element 1003. The first power supply layer 1021 is included in the fifth conductor layer 1215, and is disposed such that a part thereof is directly below the first element 1003. The first power supply layer 1021 has via holes 1021a through which vias 1027c extend and via holes 1021b through which vias 1027d extends.

As illustrated in FIGS. 7 and 8, the second power supply layer 1022 is provided in the same layer as the first power supply layer 1021 such that an interval d1 (for example, 1 μm to 200 μm) is provided between the first and second power supply layers 1021 and 1022. The second power supply layer 1022 is connected to the second element 1004 through a via 1027g and the electrode 208, and causes the return current $Ir_1$ generated by the second element 1004 to flow into the auxiliary layer 1023 as a displacement current $Id_1$. The second power supply layer 1022 is disposed such that a part thereof is directly below the second element 1004.

The ground layer 1024 is connected to the first element 1003 through a via 1027b and the electrode 1202, and to the second element 1004 though a via 1027*e* and the electrode 206. The ground layer 1024 provides a reference potential for both the first and second elements 1003 and 1004.

The first signal wiring layer 1025 is connected to the first element 1003 through the electrode 1204. The first signal wiring layer 1025 is also connected to the second element 1004 through the electrode 1205, and transmits the signal output from the first element 1003 to the second element 1004.

As illustrated in FIG. 8, the second signal wiring layer 1026 includes, for example, three signal wires, each of which is connected to the first element 1003 through the corresponding via 1027*c* and electrode 1203 and to the second element 1004 through a corresponding via 1027*f* and electrode 1207. The second signal wiring layer 1026 transmits the signal output from the first element 1003 to the second element 1004. To arrange the signal wires in regions where the auxiliary layer 1023 is not disposed, the second signal wiring layer 1026 is formed of the wiring layer 1026*a* included in the sixth conductor layer 1216 and the wiring layer 1026*b* included in the fourth conductor layer 1214.

The wiring layer 1026*a* is connected to the first element 1003 through each via 1027*c* and electrode 1203 at one end thereof, and to the wiring layer 1026*b* through each via 1027*d* at the other end thereof. The wiring layer 1026*b* is connected to the wiring layer 1026*a* through each via 1027*d* at one end thereof, and to the second element 1004 through each via 1027*f* and electrode 1207 at the other end thereof.

As illustrated in FIGS. 7 and 8, the auxiliary layer 1023 is electrically insulated from the first and second power supply layers 1021 and 1022, the first and second signal wiring layers 1025 and 1026, etc., and is included in the sixth conductor layer 1216 that is adjacent to the first and second power supply layers 1021 and 1022. The auxiliary layer 1023 is arranged so as to extend over the interval d1 between the first and second power supply layers 1021 and 1022 with one of the dielectric layers 1210 interposed between the auxiliary layer 1023 and the first and second power supply layers 1021 and 1022. The auxiliary layer 1023 includes overlapping portions that overlap the first and second power supply layers 1021 and 1022 by a length of d2. The auxiliary layer 1023 is formed in an island shape and is exposed at the back surface 1020*b*, as illustrated in FIG. 8.

Operation of Third Exemplary Embodiment

An example of an operation according to the third exemplary embodiment will now be described. First, flow of the signal output from the first element 1003 and the return current $Ir_1$ will be described.

The first element 1003 outputs a signal of, for example, 3.5 GHz at a maximum to the second element 1004 through the electrode 1204 and the first signal wiring layer 1025, or through the electrode 1203 and the second signal wiring layer 1026.

The second element 1004 receives the signal output from the first element 1003, and processes the input signal. When the signal is input to the second element 1004, the return current $Ir_1$ is generated and flows into the second power supply layer 1022.

The return current $Ir_1$ that has flowed into the second power supply layer 1022 flows into the auxiliary layer 1023 as the displacement current $Id_1$. The displacement current $Id_1$ that has flowed into the auxiliary layer 1023 flows into the first power supply layer 1021 as the displacement current $Id_2$. The displacement current $Id_2$ that has flowed into the first power supply layer 1021 returns to the first element 1003 through the electrode 1201.

Current Density Simulation

Figure 9A:
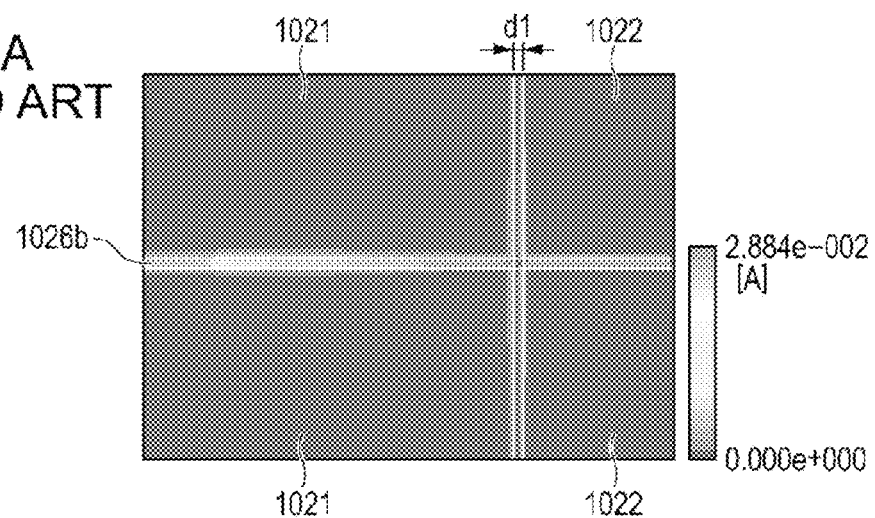
Figure 9B:
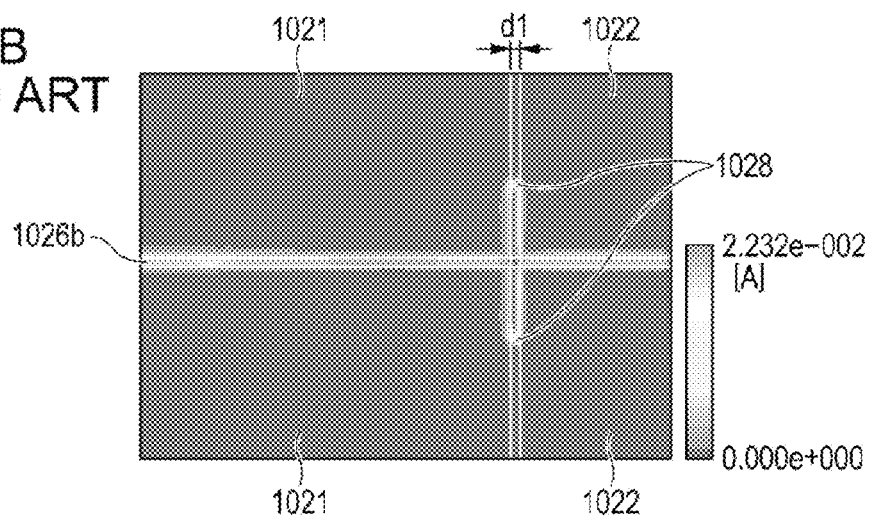
Figure 9C:
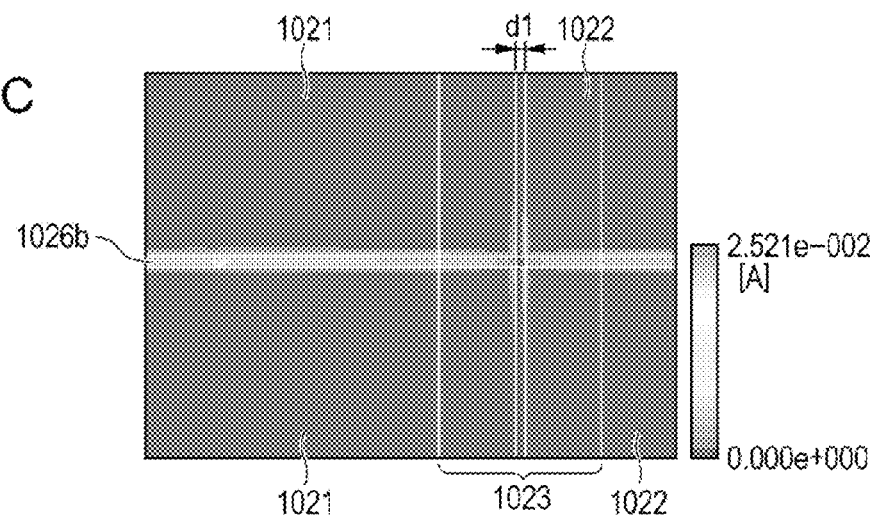

The current density of the return current $Ir_1$ of the signal output from the first element 1003 will be compared with those in comparative examples. FIGS. 9A to 9C show the simulation results of the current density in a multilayer wiring board. FIG. 9A shows the case in which a multilayer wiring board of a second comparative example is used. FIG. 9B shows the case in which a multilayer wiring board of a third comparative example is used. FIG. 9C shows the case in which the multilayer wiring board according to the present exemplary embodiment is used.

FIG. 9A shows the result of simulation performed to calculate the current density of the return current $Ir_1$ by using the multilayer wiring board of the second comparative example, which does not include the auxiliary layer 1023. This simulation result shows that the return current $Ir_1$ is divided at end portions of the first and second power supply layers 1021 and 1022 and expands over the end portions of the first and second power supply layers 1021 and 1022.

FIG. 9B shows the result of simulation performed to calculate the current density of the return current $Ir_1$ by using the multilayer wiring board of the third comparative example, which does not include the auxiliary layer 1023 but includes two capacitors 1028 that connect the first and second power supply layers 1021 and 1022 to each other. This simulation result shows that, unlike the return current $Ir_1$ illustrated in FIG. 9A, the return current $Ir_1$ illustrated in FIG. 9B concentrates between the two capacitors 1028. Namely, the capacitors 1028 allow the return current $Ir_1$ to pass therethrough from the second power supply layer 1022 to the first power supply layer 1021.

FIG. 9C shows the result of simulation performed to calculate the current density of the return current $Ir_1$ by using the multilayer wiring board 1002 according to the present exemplary embodiment. This simulation result shows that the expansion of the return current $Ir_1$ occurs in a region smaller than that in FIG. 9A, which means that the auxiliary layer 1023 allows the return current $Ir_1$ to flow from the second power supply layer 1022 into the first power supply layer 1021 as the displacement current $Id_2$. In short, since the multilayer wiring board 1002 includes the auxiliary layer 1023, the expansion of the return current $Ir_1$ may be suppressed and the radiation noise may be reduced.

Simulation of Signal Attenuation

Figure 10:
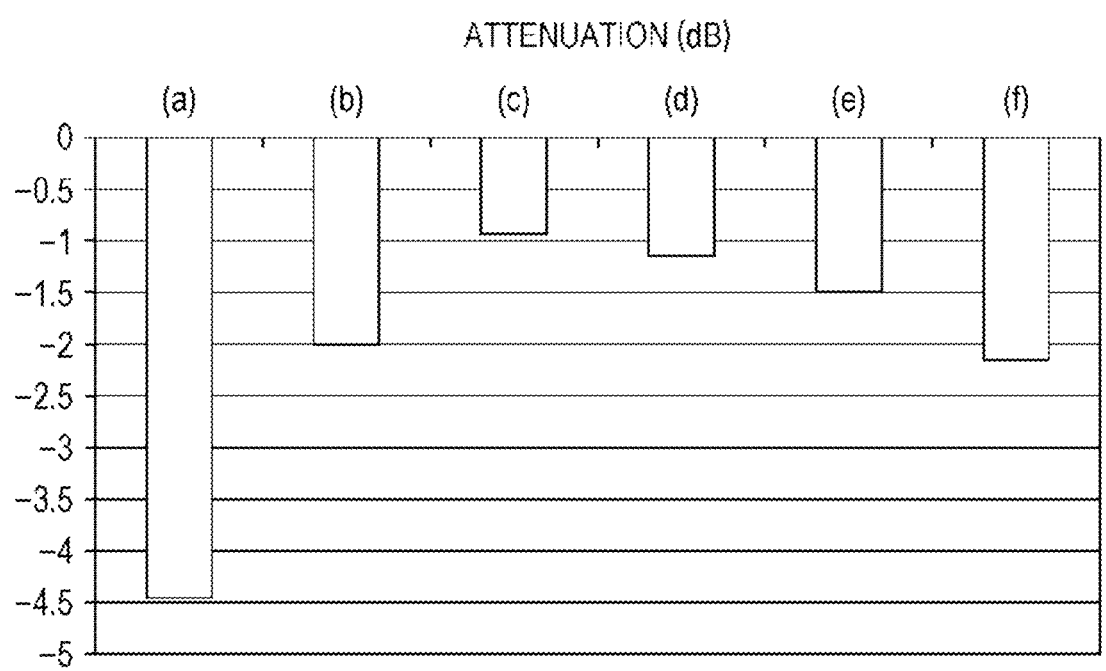
FIG. 10 shows the simulation results of attenuation of a signal output from a first element, wherein (a) shows the case in which the multilayer wiring board of the second comparative example is used, (b) shows the case in which the multilayer wiring board of the third comparative example is used, and (c), (d), (e), and (f) respectively show the cases in which multilayer wiring boards having auxiliary layers with overlap lengths of 2 mm, 1.5 mm, 1 mm, and 0.5 mm are used.

FIG. 10 shows the simulation results of attenuation of a signal output from the first element, wherein (a) shows the case in which the multilayer wiring board of the second comparative example is used, (b) shows the case in which the multilayer wiring board of the third comparative example is used, and (c), (d), (e), and (f) respectively show the cases in which multilayer wiring boards having auxiliary layers with overlap lengths of 2 mm, 1.5 mm, 1 mm, and 0.5 mm are used.

In FIG. 10, (a) shows the simulation result of attenuation of the signal output from the first element 1003 in the multilayer wiring board of the above-described second comparative example. This simulation result shows that the signal attenuation of (a) is larger than those of (b) to (f). This is because since the auxiliary layer 1023 is not provided in the second comparative example, the return current $Ir_1$ is divided between the first power supply layer 1021 and the second power supply layer 1022 and the impedance of the signal return path is increased accordingly.

In FIG. 10, (b) shows the simulation result of attenuation of the signal output from the first element 1003 in the multilayer wiring board of the above-described third comparative example. This simulation result shows that since the capacitors 1028 allow the return current $Ir_1$ to pass therethrough, the signal attenuation of (b) is smaller than that of (a). However, the signal attenuation of (b) is larger than those of (c) to (e). This is because impedance for a high-frequency component (about 3.5 GHz) of the return current $Ir_1$ is high due to the self-inductance of the capacitors 1028.

In FIG. 10, (c) shows the simulation result of attenuation of the signal output from the first element 1003 in the case where the length d2 of the overlapping portions of the auxiliary layer 1023 that overlap the first and second power supply layers 1021 and 1022 is 2 mm. This simulation result shows that since the auxiliary layer 1023 is provided, the signal attenuation of (c) is smaller than those of (a) and (b). This is because since the auxiliary layer 1023 allows the return current $Ir_1$ that flows through the second power supply layer 1022 to flow into the first power supply layer 1021 as the displacement current $Id_2$, the impedance of the signal return path for the return current $Ir_1$ is reduced.

The simulation result of (c) in FIG. 10 also shows that the signal attenuation of (c) is smaller than those of (d) to (f), which show the cases in which the length d2 of the overlapping portions of the auxiliary layer 1023 is smaller than that in the case of (c). This is because since the length d2 of the overlapping portions is longer in the case of (c) than in the cases of (d) to (f), the overlapping areas between the auxiliary layer 1023 and the first and second power supply layers 1021 and 1022 are increased, and stray capacitance between the auxiliary layer 1023 and the first and second power supply layers 1021 and 1022 are increased accordingly. Since the stray capacitance is increased, the displacement currents $Id_1$ and $Id_2$ may be easily generated between the auxiliary layer 1023 and the first and second power supply layers 1021 and 1022, so that the impedance of the signal return path is reduced.

Advantages of Third Exemplary Embodiment

The third exemplary embodiment provides the following advantages. (a) Since the second power supply layer 1022 is electrically insulated from the first power supply layer 1021, the operation of the first element 1003 may be stopped while the electric power is continuously supplied to the second element 1004.

(b) Since the auxiliary layer 1023 is disposed adjacent to the first and second power supply layers 1021 and 1022 with one of the dielectric layers 1210 interposed therebetween, the attenuation of the signal output from the first element 1003 may be reduced.

(c) The attenuation of the signal output from the first element 1003 may be further reduced by setting the length d2 of the overlapping portions of the auxiliary layer 1023 to an adequate length.

Fourth Exemplary Embodiment

Figure 11:
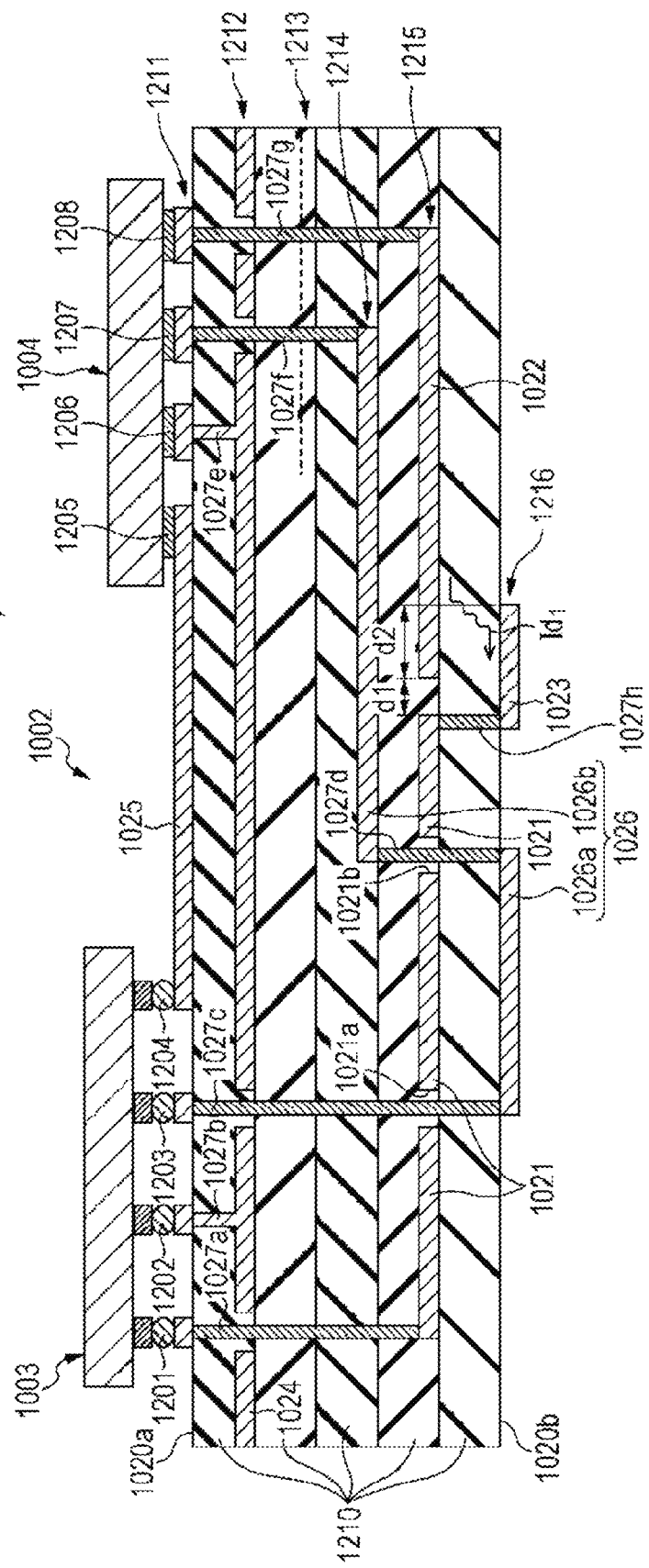
FIG. 11 is a sectional view of an example of a semiconductor device according to a fourth exemplary embodiment of the present invention.

FIG. 11 is a sectional view illustrating an example of the structure of a semiconductor device 1001 according to a fourth exemplary embodiment of the present invention.

In the third exemplary embodiment, the auxiliary layer 1023 of the multilayer wiring board 1002 is electrically insulated from the first and second power supply layers 1021 and 1022. In contrast, an auxiliary layer 1023 of the present exemplary embodiment is connected to one of first and second power supply layers 1021 and 1022. Other structures of the present exemplary embodiment are similar to those of the third exemplary embodiment.

In the fourth exemplary embodiment, the auxiliary layer 1023 is connected to the first power supply layer 1021 through a via 1027h, and causes a return current $Ir_1$ of a signal from a first element 1003 to flow thereinto as the displacement current $Id_2$.

Operation of Fourth Exemplary Embodiment

When a second element 1004 receives the signal from the first element 1003, the return current $Ir_1$ is generated and flows into the second power supply layer 1022. The return current $Ir_1$ that has flowed into the second power supply layer 1022 flows into the auxiliary layer 1023 as the displacement current $Id_2$. The displacement current $Id_2$ that has flowed into the auxiliary layer 1023 flows through the first power supply layer 1021 and returns to the first element 1003.

Since the auxiliary layer 1023 is connected to the first power supply layer 1021, the displacement current $Id_2$ does not flow into the first power supply layer 1021 as the displacement current $Id_2$. Therefore, the impedance of the signal return path for the return current $Ir_1$ is reduced.

Advantage of Fourth Exemplary Embodiment

The fourth exemplary embodiment provides the following advantage.

That is, since the auxiliary layer 1023 is connected to the first power supply layer 1021, the signal quality is increased compared to that in the case in which the auxiliary layer 1023 is electrically insulated from the first and second power supply layers 1021 and 1022.

Fifth Exemplary Embodiment

Figure 12:
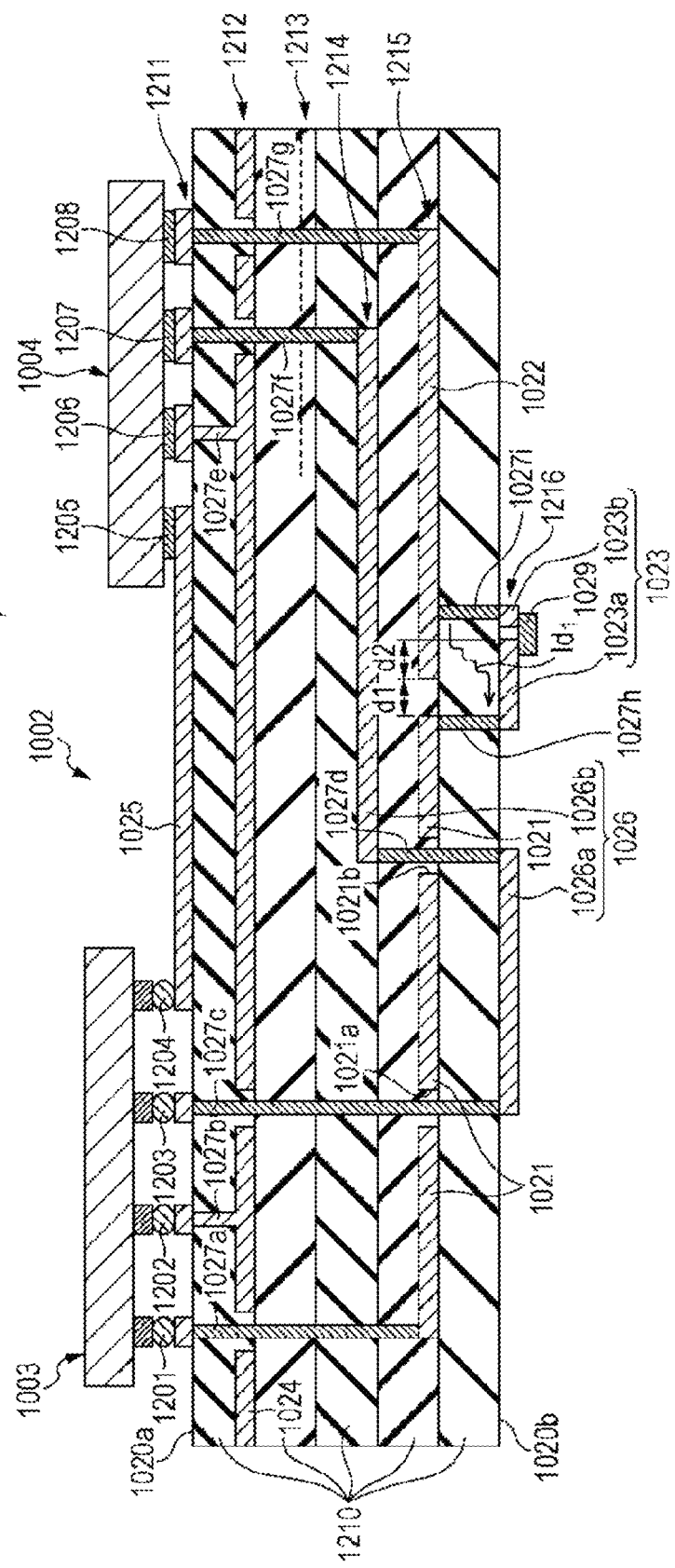
FIG. 12 is a sectional view of an example of a semiconductor device according to a fifth exemplary embodiment of the present invention.

FIG. 12 is a sectional view illustrating an example of the structure of a semiconductor device 1001 according to a fifth exemplary embodiment of the present invention.

In the third exemplary embodiment, the auxiliary layer 1023 of the multilayer wiring board 1002 is electrically insulated from the first and second power supply layers 1021 and 1022. In contrast, an auxiliary layer 1023 of the present exemplary embodiment is connected to first and second power supply layers 1021 and 1022, and is provided with a capacitor 1029 that allows a low-frequency component of a return current $Ir_1$ to pass therethrough. The capacitor 1029 has a capacitance such that the impedance due to the capacitance at a minimum frequency of the signal is, for example, 1Ω or less, and has a characteristic such that the impedance including the mounting inductance thereof and the impedance due to the capacitance between the auxiliary layer and the second power supply layer cross in the range of, for example, 1Ω or less. The impedance is determined on the basis of the signal quality required by the design. When a high-quality signal is required, the impedance needs to be reduced accordingly. Other structures of the present exemplary embodiment are similar to those in the third exemplary embodiment.

According to the present exemplary embodiment, the auxiliary layer 1023 includes an auxiliary layer 1023a connected to the first power supply layer 1021, an auxiliary layer 1023b connected to the second power supply layer 1022, and the capacitor 1029 that connects the auxiliary layers 1023a and 1023b to each other. The capacitor 1029 is exposed at the back surface 1020b.

The auxiliary layer 1023*a* is connected to the first power supply layer 1021 through a via 1027*h* at one end thereof, and to the capacitor 1029 at the other end thereof. The auxiliary layer 1023*a* allows a high-frequency component of a return current $Ir_1$ to flow into the first power supply layer 1021 as a displacement current $Id_1$. The auxiliary layer 1023*b* is connected to a via 1027*i* at one end thereof, and to the capacitor 1029 at the other end thereof. The auxiliary layer 1023*b* allows a low-frequency component of the return current $Ir_1$ to flow into the first power supply layer 1021 through the capacitor 1029 and the auxiliary layer 1023*a*. The capacitor 1029 allows the low-frequency component of the return current $Ir_1$ to pass therethrough from the auxiliary layer 1023*b* to the auxiliary layer 1023*a*.

Operation of Fifth Exemplary Embodiment

The high-frequency component of the return current $Ir_1$ that flows through the second power supply layer 1022 flows into the first auxiliary layer 1023*a* as the displacement current $Id_1$, which flows through the first power supply layer 1021 and returns to the first element 1003.

The low-frequency component of the return current $Ir_1$ that flows through the second power supply layer 1022 flows into the first auxiliary layer 1023*a* from the second auxiliary layer 1023*b* through the capacitor 1029. The low-frequency component of the return current $Ir_1$ that has flowed into the first auxiliary layer 1023*a* flows through the first power supply layer 1021 and returns to the first element 1003.

The low-frequency component of the return current $Ir_1$ does not easily flow into the auxiliary layer 1023 from the second power supply layer 1022 as the displacement current $Id_1$ owing to the capacitance between the second power supply layer 1022 and the auxiliary layer 1023, and therefore passes through the capacitor 1029 from the auxiliary layer 1023*a* to the auxiliary layer 1023*b*.

Advantage of Fifth Exemplary Embodiment

The fifth exemplary embodiment provides the following advantage.

That is, since the capacitor 1029 is provided, the path including the capacitor 1029 functions as a path for the low-frequency component of the return current $Ir_1$.

MODIFICATIONS

Although exemplary embodiments are described above, exemplary embodiments of the present invention are not limited to the above-described first to fifth exemplary embodiments, and various exemplary embodiments are possible within the scope of the present invention. For example, although the multilayer wiring board 2 has a six-layer structure including the first to sixth conductor layers 211 to 216 in the first and second exemplary embodiments, the number of conductor layers is not limited to six.

Similarly, although the multilayer wiring board 1002 has a six-layer structure including the first to sixth conductor layers 1211 to 1216 in the third to fifth exemplary embodiments, the number of conductor layers is not limited to six.

Although the first and second power supply layers 21 and 22 are included in the sixth conductor layer 216 and exposed at the back surface 20*b* in the first and second exemplary embodiments, they may instead be included in one of the second to fifth conductor layers 212 to 215 of the multilayer wiring board 2.

Although the first and second power supply layers 21 and 21 are disposed independently of each other in the same conductor layer in the first and second exemplary embodiments, the first and second power supply layers 21 and 21 may instead be disposed in different conductor layers.

Although the first element 4 or the second element 5 is mounted on each of the mounting boards 3 and 6 in the first and second exemplary embodiments, plural first or second elements 4 or 5 or other elements may be mounted on the mounting boards 3 and 6.

Although the auxiliary layer 1023 is included in the sixth conductor layer 1216 according to the third to fifth exemplary embodiments, the auxiliary layer 1023 may instead be included in the another conductor layer that is adjacent to the first and second power supply layers 1021 and 1022 with one of the dielectric layers 1210 interposed therebetween.

Although the first element 1003 outputs a signal and the second element 1004 receives the signal output from the first element 1003 according to the third to fifth exemplary embodiments, the first and second elements 1003 and 1004 may instead communicate with each other in other exemplary embodiments of the present invention.

The components of the above-described exemplary embodiments may be used in combination within the scope of the present invention. For example, the capacitor 1029 described in the fifth exemplary embodiment may be applied to other exemplary embodiments.

In addition, some of the components described in the above-described exemplary embodiments may be omitted within the scope of the present invention.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A multilayer wiring board comprising:
   a signal electrode, a first power supply electrode, and a ground electrode that are provided on a mounting surface and connected to a first element that outputs a signal;
   an electrode that is provided on the mounting surface and connected to a second element that receives the signal output from the first element through the signal electrode;
   a ground layer that is provided for both the first and second elements and serves as a return path for a return current of the signal received by the second element;
   a first power supply layer that is disposed adjacent to the ground layer with a dielectric layer interposed therebetween and supplies electric power to the first element through the first power supply electrode; and
   a second power supply layer that is provided independently of the first power supply layer and supplies electric power to the second element,
   wherein the first power supply layer causes the return current that flows through the ground layer to return to the first element through the first power supply electrode as a displacement current between the ground layer and the first power supply layer.

2. The multilayer wiring board according to claim 1, wherein the signal electrode is closer to the first power supply electrode than the ground electrode, and capacitive and inductive coupling between a path through which the signal is output from the first element and a path through which electric power is supplied from the first power supply layer to the first element is smaller than capacitive and inductive coupling between the path through which the signal is output from the first element and a path that connects the first element to the ground layer at a ground potential.

3. The multilayer wiring board according to claim 2, further comprising:
   a capacitor that connects the first power supply layer and the ground layer to each other,
   wherein the capacitor allows a low-frequency component of the return current that flows through the ground layer to pass therethrough to the first power supply layer.

4. The multilayer wiring board according to claim 3, wherein the first and second elements communicate with each other, and
   wherein the second power supply layer is disposed adjacent to the ground layer with a dielectric layer interposed therebetween and supplies electric power to the second element through a second power supply electrode, the second power supply layer causing the return current that flows through the ground layer to return to the second element through the second power supply electrode as a displacement current between the ground layer and the second power supply layer.

5. The multilayer wiring board according to claim 2, wherein the first and second elements communicate with each other, and
   wherein the second power supply layer is disposed adjacent to the ground layer with a dielectric layer interposed therebetween and supplies electric power to the second element through a second power supply electrode, the second power supply layer causing the return current that flows through the ground layer to return to the second element through the second power supply electrode as a displacement current between the ground layer and the second power supply layer.

6. The multilayer wiring board according to claim 1, further comprising:
   a capacitor that connects the first power supply layer and the ground layer to each other,
   wherein the capacitor allows a low-frequency component of the return current that flows through the ground layer to pass therethrough to the first power supply layer.

7. The multilayer wiring board according to claim 6, wherein the first and second elements communicate with each other, and
   wherein the second power supply layer is disposed adjacent to the ground layer with a dielectric layer interposed therebetween and supplies electric power to the second element through a second power supply electrode, the second power supply layer causing the return current that flows through the ground layer to return to the second element through the second power supply electrode as a displacement current between the ground layer and the second power supply layer.

8. The multilayer wiring board according to claim 1, wherein the first and second elements communicate with each other, and
   wherein the second power supply layer is disposed adjacent to the ground layer with a dielectric layer interposed therebetween and supplies electric power to the second element through a second power supply electrode, the second power supply layer causing the return current that flows through the ground layer to return to the second element through the second power supply electrode as a displacement current between the ground layer and the second power supply layer.

9. A multilayer wiring board comprising:
   a first power supply layer that supplies electric power to a first element that outputs a signal;
   a second power supply layer that is electrically insulated from the first power supply layer and provided in the same layer as the first power supply layer, the second power supply layer supplying electric power to a second element that receives the signal output from the first element and serving as a return path for a return current of the signal output from the first element; and
   an auxiliary layer that is provided in a conductor layer adjacent to the first and second power supply layers so as to partially overlap the first and second power supply layers with a dielectric layer interposed between the auxiliary layer and the first and second power supply layers, the auxiliary layer causing the return current that flows through the second power supply layer to flow into the first power supply layer as a displacement current.

10. The multilayer wiring board according to claim 9, wherein the auxiliary layer is connected to one of the first and second power supply layers.

11. The multilayer wiring board according to claim 10, wherein the auxiliary layer includes a capacitor that allows a low-frequency component of the return current to pass therethrough.

12. The multilayer wiring board according to claim 9, wherein the auxiliary layer includes a capacitor that allows a low-frequency component of the return current to pass therethrough.

* * * * *